US012677671B2

(12) United States Patent
    Yamamoto

(10) Patent No.: US 12,677,671 B2
(45) Date of Patent: Jul. 7, 2026

(54) HIGH-FREQUENCY MODULE HAVING A FILTER ON A MOUNTING SUBSTRATE

(71) Applicant: Murata Manufacturing Co., Ltd., Kyoto (JP)

(72) Inventor: Hiroyuki Yamamoto, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 585 days.

(21) Appl. No.: 18/329,078

(22) Filed: Jun. 5, 2023

(65) Prior Publication Data

US 2023/0317646 A1     Oct. 5, 2023

Related U.S. Application Data

(63) Continuation of application No. PCT/JP2022/001417, filed on Jan. 17, 2022.

(30) Foreign Application Priority Data

Jan. 29, 2021    (JP) ................................. 2021-013308

(51) Int. Cl.
    *H10W 44/20*          (2026.01)
(52) U.S. Cl.
    CPC .......... *H10W 44/20* (2026.01); *H10W 44/248* (2026.01)
(58) Field of Classification Search
    CPC ............. H01L 23/66; H01L 2223/6677; H01L 2223/6616; H01L 2223/6627; H01L 2223/6655; H01L 23/49816; H01L 23/49822; H04B 1/38; H05K 1/18; H05K 3/34; H10W 44/20; H10W 44/248; H10W 44/209; H10W 44/216; H10W 44/234; H10W 70/685; H10W 90/701–798
    See application file for complete search history.

(56) References Cited

U.S. PATENT DOCUMENTS

| | | | | |
|---|---|---|---|---|
| 5,952,709 | A * | 9/1999 | Kitazawa ............. | H05K 1/0243 257/664 |
| 10,250,197 | B1 * | 4/2019 | Schultz ................... | H01L 23/66 |
| 2001/0018982 | A1 | 9/2001 | Gotoh et al. | |
| 2010/0109052 | A1 * | 5/2010 | Nakajima .......... | H10D 84/0149 257/E27.06 |

(Continued)

FOREIGN PATENT DOCUMENTS

| | | |
|---|---|---|
| JP | H11-40942 A | 2/1999 |
| JP | 2018-082339 A | 5/2018 |

(Continued)

OTHER PUBLICATIONS

International Search Report for PCT/JP2022/001417 dated Apr. 19, 2022.

*Primary Examiner* — Scott B Geyer
(74) *Attorney, Agent, or Firm* — McDonald Hopkins LLC

(57) ABSTRACT

A high-frequency module includes a mounting substrate and a filter. The filter includes a first RF terminal, a second RF terminal, and a ground terminal. The ground terminal is located between the first RF terminal and the second RF terminal in plan view in a thickness direction of the mounting substrate. The mounting substrate has a ground layer on a first principal surface. The ground terminal is formed by a solder bump and connected to the ground layer. The ground layer has a through-hole in contact with the ground terminal.

20 Claims, 5 Drawing Sheets

(56) References Cited

U.S. PATENT DOCUMENTS

| | | | |
|---|---|---|---|
| 2014/0045546 A1 | 2/2014 | Onodera | |
| 2017/0047963 A1* | 2/2017 | Hayakawa | H04B 1/44 |
| 2017/0118877 A1* | 4/2017 | Kumbhat | H01L 24/97 |
| 2017/0162514 A1* | 6/2017 | Deng | H01L 23/49811 |
| 2018/0138891 A1 | 5/2018 | Ozasa | |
| 2019/0363695 A1 | 11/2019 | Taguchi | |
| 2020/0228151 A1* | 7/2020 | Naniwa | H05K 1/0237 |
| 2020/0343214 A1* | 10/2020 | Seki | H01L 24/73 |
| 2021/0066265 A1* | 3/2021 | Eid | H01L 23/642 |
| 2021/0315096 A1* | 10/2021 | Matsubara | H05K 1/181 |

FOREIGN PATENT DOCUMENTS

| | | | |
|---|---|---|---|
| JP | 2019-205065 A | 11/2019 | |
| WO | 2008/029641 A1 | 3/2008 | |
| WO | 2012/144228 A1 | 10/2012 | |

* cited by examiner

FIG. 1

HIGH-FREQUENCY MODULE HAVING A FILTER ON A MOUNTING SUBSTRATE

CROSS REFERENCE TO RELATED APPLICATION

This is a continuation of International Application No. PCT/JP2022/001417 filed on Jan. 17, 2022 which claims priority from Japanese Patent Application No. 2021-013308 filed on Jan. 29, 2021. The contents of these applications are incorporated herein by reference in their entireties.

BACKGROUND OF THE DISCLOSURE

Field of the Disclosure

The present disclosure generally relates to a high-frequency module and a communication device and particularly relates to a high-frequency module which allows a high-frequency signal to pass therethrough and a communication device having the high-frequency module.

Description of the Related Art

In the related art, a high-frequency module having a surface acoustic wave filter (filter) provided with a ground terminal disposed between an input terminal (RF terminal) and an output terminal (RF terminal) on a principal surface of a piezoelectric substrate is known (see Patent Document 1).

Patent Document 1: Japanese Unexamined Patent Application Publication No. 2018-82339

BRIEF SUMMARY OF THE DISCLOSURE

Meanwhile, in the high-frequency module described in Patent Document 1, there is a case where a ground between the two RF terminals is further strengthened. In this case, in order to strengthen the ground between the two RF terminals, it may be considered that a ground layer is formed on a surface of a principal surface where the filter is disposed and the ground terminal of the filter is connected to the ground layer. In this case, a solder bump is used as the ground terminal to connect the ground terminal to the ground layer. When the ground terminal is connected to the ground layer, there is a problem that an amount of solder of the solder bump which flows out to the ground layer is large.

The present disclosure is made in view of the above-mentioned problem, and one possible benefit thereof is to provide a high-frequency module and a communication device capable of reducing an amount of solder for the connection between a ground terminal and a ground layer to flow out to the ground layer while strengthening a ground between two RF terminals.

A high-frequency module according to an aspect of the present disclosure includes a mounting substrate and a filter. The mounting substrate has a first principal surface and a second principal surface opposed to each other. The filter is disposed at the first principal surface of the mounting substrate and configured to allow a high-frequency signal to pass therethrough. The filter includes a first RF terminal, a second RF terminal, and a ground terminal. The ground terminal is located between the first RF terminal and the second RF terminal in plan view in a thickness direction of the mounting substrate. The mounting substrate has a ground layer on the first principal surface. When the mounting substrate is seen in a direction orthogonal to a direction connecting the first RF terminal and the second RF terminal, at least a portion of the ground layer is disposed between the first RF terminal and the second RF terminal. The ground terminal is formed by a solder bump and connected to the ground layer. The ground layer has a through-hole in contact with the ground terminal.

A high-frequency module according to an aspect of the present disclosure includes a mounting substrate and a filter. The mounting substrate has a first principal surface and a second principal surface opposed to each other. The filter is disposed at the first principal surface of the mounting substrate and configured to allow a high-frequency signal to pass therethrough. The filter includes a first RF terminal, a second RF terminal, and a ground terminal. The ground terminal is located between the first RF terminal and the second RF terminal in plan view in a thickness direction of the mounting substrate. The mounting substrate has a ground layer on the first principal surface. When the mounting substrate is seen in a direction orthogonal to a direction connecting the first RF terminal and the second RF terminal, at least a portion of the ground layer is disposed between the first RF terminal and the second RF terminal. The ground layer has a first portion, a second portion, and at least two bridging parts. The first portion is connected to the ground terminal. The second portion is disposed between the first RF terminal and the second RF terminal when seen in the direction orthogonal to the direction connecting the first RF terminal and the second RF terminal. The at least two bridging parts connect the first portion to the second portion. The ground terminal is formed by a solder bump and connected to each of the at least two bridging parts.

A communication device according to an aspect of the present disclosure includes the above-mentioned high-frequency module and a signal processing circuit configured to process the high-frequency signal that passes through the high-frequency module.

According to the present disclosure, an amount of solder for the connection between the ground terminal and the ground layer to flow out to the ground layer can be reduced while the ground between the two RF terminals is strengthened.

BRIEF DESCRIPTION OF THE SEVERAL VIEWS OF THE DRAWINGS

FIG. 1 is a schematic circuit diagram illustrating a high-frequency module according to an embodiment.

DETAILED DESCRIPTION OF THE DISCLOSURE

Figure 2:
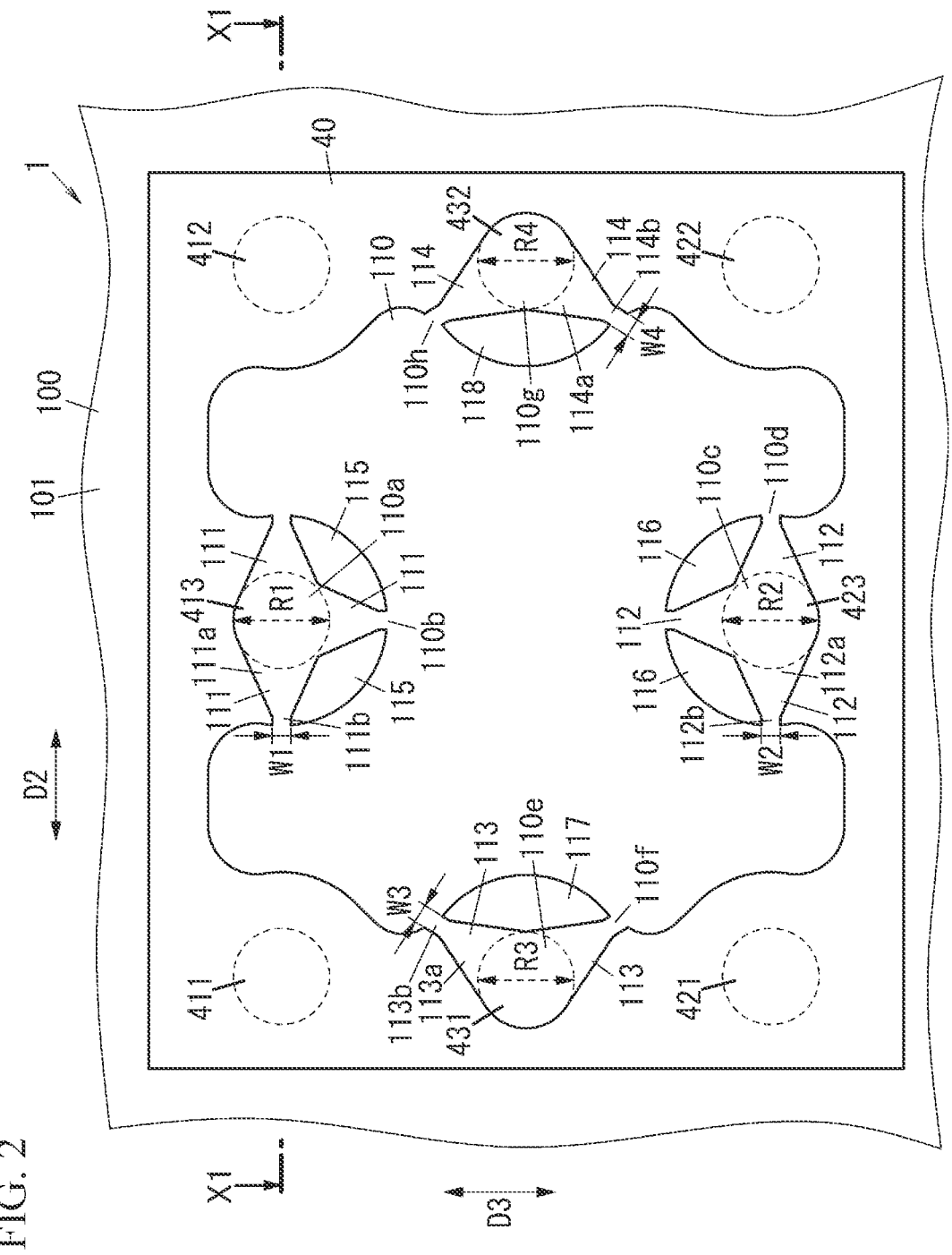
FIG. 2 is a partial perspective plan view of the high-frequency module.

FIGS. 2 to 5 referred to in the following embodiment and the like are all schematic views, and ratios of sizes and thicknesses of components in the drawings do not necessarily reflect the actual size ratios.

Embodiment

Figure 1:
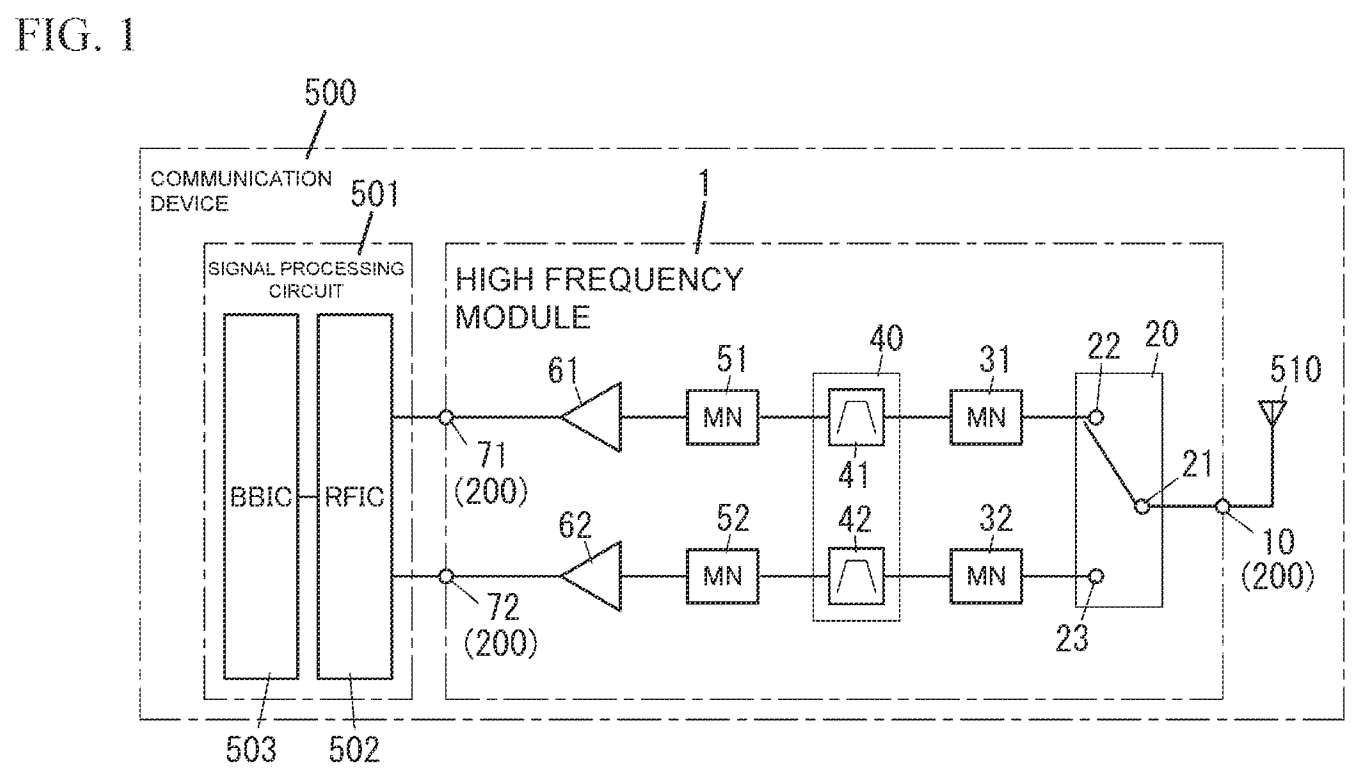

Hereinafter, a high-frequency module 1 and a communication device 500 according to this embodiment are described with reference to FIGS. 1 to 3.

(1) Overview

As illustrated in FIG. 1, the high-frequency module 1 includes an antenna terminal 10, a switch 20, a first matching circuit 31, a second matching circuit 32, a filter 40, a third matching circuit 51, a fourth matching circuit 52, a first low-noise amplifier 61, and a second low-noise amplifier 62. As illustrated in FIGS. 2 and 3, the high-frequency module 1 further includes a mounting substrate 100 and a resin layer 120.

Figure 3:
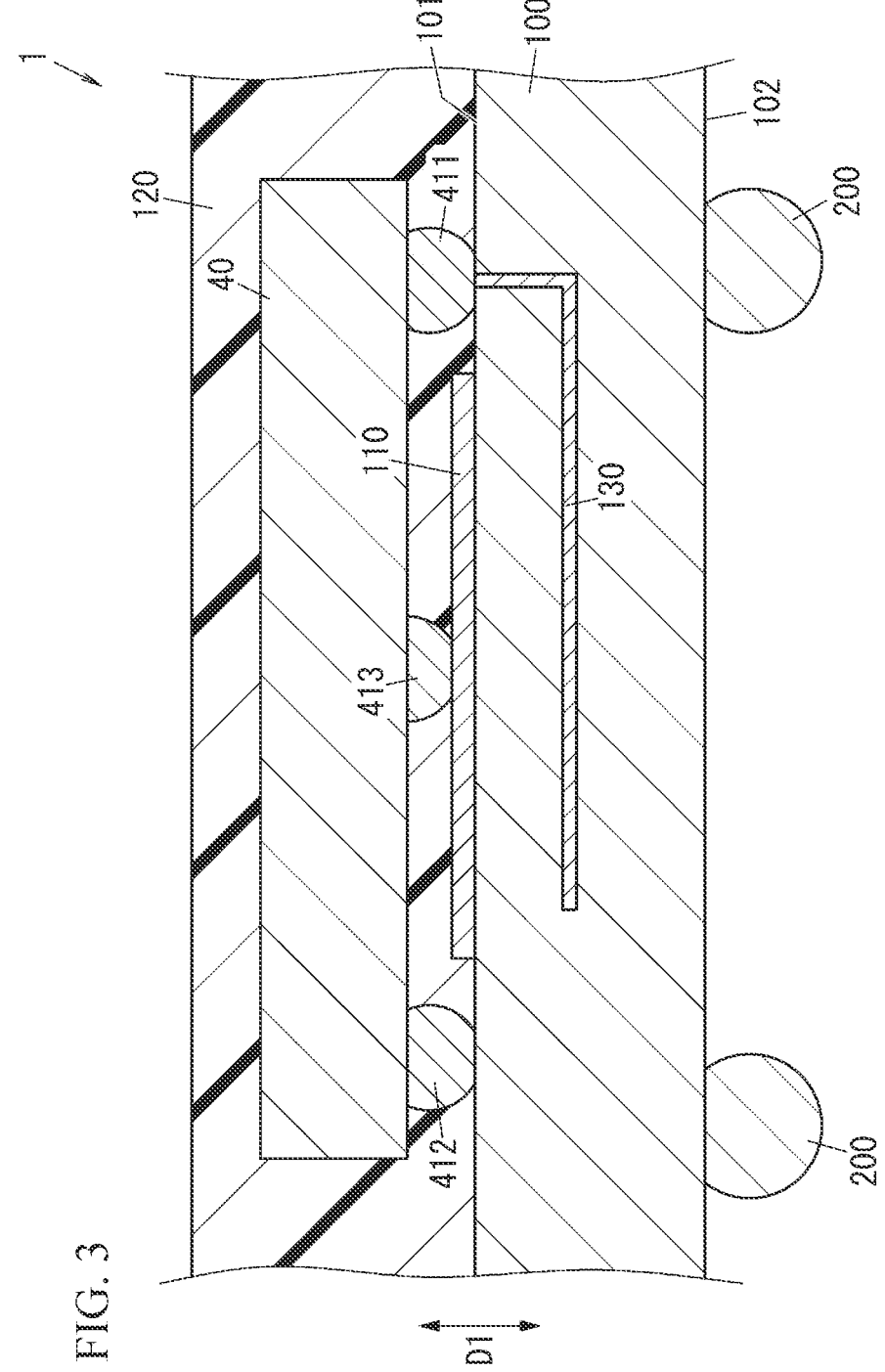
FIG. 3 is a sectional view of a portion of the high-frequency module taken along line X1-X1 in FIG. 2.

The mounting substrate 100 has a first principal surface 101 and a second principal surface 102 opposed to each other in a thickness direction D1 of the mounting substrate 100 (see FIG. 3). The mounting substrate 100 has, on the first principal surface 101, a ground layer 110 which is a ground electrode (see FIG. 2).

The filter 40 is disposed at the first principal surface 101 of the mounting substrate 100 and allows a high-frequency signal to pass therethrough. The filter 40 includes two filters (a first filter 41 and a second filter 42).

The first filter 41 includes a first radio frequency (RF) terminal 411, a second RF terminal 412, and a first ground terminal 413. The second filter 42 includes a third RF terminal 421, a fourth RF terminal 422, and a second ground terminal 423. That is, the filter 40 includes the first RF terminal 411, the second RF terminal 412, and the first ground terminal 413. Further, the filter 40 includes the third RF terminal 421, the fourth RF terminal 422, and the second ground terminal 423. The first RF terminal 411, the second RF terminal 412, and the first ground terminal 413 are each formed by a solder bump. Similarly, the third RF terminal 421, the fourth RF terminal 422, and the second ground terminal 423 are each formed by a solder bump. Each of the first RF terminal 411, the second RF terminal 412, the third RF terminal 421, and the fourth RF terminal 422 is also formed by a solder bump. The solder bump forming each of the first RF terminal 411, the second RF terminal 412, the third RF terminal 421, the fourth RF terminal 422, the first ground terminal 413, and the second ground terminal 423 is, for example, the alloy of copper and tin. The first RF terminal 411, the second RF terminal 412, the third RF terminal 421, and the fourth RF terminal 422 are terminals (signal terminals) through which high-frequency signals pass.

The first ground terminal 413 is electrically connected to the ground layer 110. Here, "being connected" intends to be linked electrically. That is, "the first ground terminal 413 being electrically connected to the ground layer 110" intends that the first ground terminal 413 and the ground layer 110 are electrically linked together.

Further, the second ground terminal 423 is electrically connected to the ground layer 110.

The first ground terminal 413 is disposed between the first RF terminal 411 and the second RF terminal 412 in plan view in the thickness direction D1 of the mounting substrate 100. Further, the second ground terminal 423 is disposed between the third RF terminal 421 and the fourth RF terminal 422 in plan view in the thickness direction D1 of the mounting substrate 100. Here, "being disposed" intends that an electronic component or the like which is a positioning target object is placed at a certain position. That is, "the second ground terminal 423 being disposed between the third RF terminal 421 and the fourth RF terminal 422" intends that the second ground terminal 423 is disposed at a certain position between the third RF terminal 421 and the fourth RF terminal 422.

For example, the ground layer 110 is formed by copper, which is a so-called copper electrode. The ground layer 110 has a through-hole 115 (first through-hole 115) in contact with the first ground terminal 413 (see FIG. 2). Further, the ground layer 110 has a through-hole 116 (second through-hole 116) in contact with the second ground terminal 423 and different from the first through-hole 115 (see FIG. 2).

In the high-frequency module 1, a plurality of electronic components are mounted on the first principal surface 101 or the second principal surface 102 of the mounting substrate 100. Here, "the electronic component being mounted on the first principal surface 101 (or the second principal surface 102) of the mounting substrate 100" includes that the electronic component is disposed at (mechanically connected to) the mounting substrate 100 and the electronic component is electrically connected to (a suitable conductor part of) the mounting substrate 100. Therefore, in the high-frequency module 1, each of the plurality of electronic components is disposed at the first principal surface 101 or the second principal surface 102 of the mounting substrate 100. The plurality of electronic components are not limited to components mounted on the mounting substrate 100 and may include circuit devices provided inside the mounting substrate 100. In FIG. 3, the illustration of a conductor part and a plurality of wiring lines configured by via conductors and the like, of the mounting substrate 100 is omitted. In this embodiment, the plurality of electronic components are mounted on the first principal surface 101 of the mounting substrate 100.

(2) Configuration

Below, the configurations of the high-frequency module 1 and the communication device 500 according to Embodiment 1 are described with reference to FIGS. 1 to 3.

The high-frequency module 1 according to this embodiment is used for, for example, the communication device 500. The communication device 500 is, but not limited to, for example, a cellular phone (for example, a smartphone), or it may be, for example, a wearable terminal (for example, a smartwatch). The high-frequency module 1 is a module that supports, for example, the 4th generation mobile communication (4G) standard or the 5th generation mobile communication (5G) standard. The 4G standard is, for example, the Third Generation Partnership Project (3GPP) Long-Term Evolution (LTE) standard. The 5G standard is, for example, the 5G New Radio (NR). The high-frequency module 1 is, for example, a module that supports carrier aggregation and dual connectivity. Here, the carrier aggregation and the dual connectivity are communication simultaneously using radio waves in a plurality of frequency bands.

The high-frequency module 1 is configured such that, for example, a reception signal (high-frequency signal) inputted from an antenna 510 is amplified and outputted to a signal processing circuit 501. The signal processing circuit 501 is not a component of the high-frequency module 1 but is a component of the communication device 500 having the high-frequency module 1. The high-frequency module 1 is controlled by, for example, the signal processing circuit 501 included in the communication device 500. The communication device 500 includes the high-frequency module 1 and the signal processing circuit 501. The communication device 500 further includes the antenna 510. The communication device 500 further includes a circuit board on which the high-frequency module 1 is mounted. The circuit board is a printed wiring board, for example. The circuit board has a ground electrode to which a ground potential is given.

The signal processing circuit 501 processes a signal (for example, a reception signal) which passes through the high-frequency module 1. The signal processing circuit 501 includes, for example, an RF signal processing circuit 502 and a baseband signal processing circuit 503. The RF signal processing circuit 502 is, for example, a radio frequency integrated circuit (RFIC) and performs signal processing on the high-frequency signal. For example, the RF signal processing circuit 502 performs signal processing such as upconversion on the high-frequency signal (transmission signal) outputted from the baseband signal processing circuit 503 and outputs the processed high-frequency signal. Moreover, for example, the RF signal processing circuit 502 performs signal processing such as downconversion on the high-frequency signal (reception signal) outputted from the high-frequency module 1 and outputs the processed high-frequency signal to the baseband signal processing circuit 503.

The baseband signal processing circuit 503 is, for example, a baseband integrated circuit (BBIC). The baseband signal processing circuit 503 generates an I-phase signal and a Q-phase signal from a baseband signal. The baseband signal is, for example, an audio signal, an image signal, or the like, inputted from outside. The baseband signal processing circuit 503 performs IQ modulation processing by combining the I-phase signal and the Q-phase signal and outputs a transmission signal. At this time, the transmission signal is generated as a modulated signal (IQ signal), which is obtained through amplitude modulation performed on a carrier signal of a given frequency in a period longer than a period of the carrier signal. The reception signal processed by the baseband signal processing circuit 503 is used as, for example, an image signal for an image display or as an audio signal for a call. The high-frequency module 1 according to Embodiment 1 transmits the high-frequency signal (reception signal) between the antenna 510 and the RF signal processing circuit 502 of the signal processing circuit 501.

As illustrated in FIG. 1, the high-frequency module 1 includes the antenna terminal 10, the switch 20, the first matching circuit 31, the second matching circuit 32, the filter 40, the third matching circuit 51, the fourth matching circuit 52, the first low-noise amplifier 61, and the second low-noise amplifier 62. As illustrated in FIG. 1, the high-frequency module 1 further includes signal output terminals 71 and 72.

The antenna terminal 10 is electrically connected to the antenna 510. Here, "being connected" intends to be linked electrically.

The switch 20 is capable of connecting the antenna 510 to the filter 40. That is, the switch 20 is capable of simultaneously connecting the first filter 41 and the second filter 42 to the antenna 510. By the simultaneous connection of the first filter 41 and the second filter 42, simultaneous communication of the first filter 41 and the second filter 42 becomes possible. "Simultaneous communication being possible" means that simultaneous communication is possible in a frequency band in which simultaneous communication is defined as possible by the 3GPP LTE standard.

The switch 20 is electrically connected to the antenna terminal 10. The switch 20 is electrically connected to the first filter 41 and the second filter 42. In detail, the switch 20 has a common terminal 21 and a plurality of (two in the drawing) selection terminals 22 and 23. The switch 20 is controlled by the signal processing circuit 501 to select at least one of the plurality of selection terminals 22 and 23 as a connection target of the common terminal 21. That is, the switch 20 selectively connects the antenna 510 to the first filter 41 and the second filter 42. The common terminal 21 is electrically connected to the antenna terminal 10. That is, the common terminal 21 is electrically connected to the antenna 510 with the antenna terminal 10 interposed therebetween. Note that the common terminal 21 is not limited to be directly connected to the antenna 510. A filter, a coupler, or the like, may be provided between the common terminal 21 and the antenna 510. The selection terminal 22 is electrically connected to the first filter 41. The selection terminal 23 is electrically connected to the second filter 42.

The first matching circuit 31 is, for example, an inductor. The first matching circuit 31 is electrically connected in a path between the switch 20 and the first filter 41 and performs the impedance matching between the switch 20 and the first filter 41. The second matching circuit 32 is electrically connected in a path between the selection terminal 23 of the switch 20 and the second filter 42 and performs the impedance matching between the switch 20 and the second filter 42.

The filter 40 is disposed at the first principal surface 101 of the mounting substrate 100 and allows a high-frequency signal (reception signal) received by the antenna 510 to pass therethrough. The filter 40 includes the two filters (the first filter 41 and the second filter 42). For example, the first filter 41 and the second filter 42 are formed into one chip. Each of the first filter 41 and the second filter 42 is a reception filter which allows the reception signal to pass therethrough.

The first filter 41 is a filter which allows a reception signal in a given frequency band received by the antenna 510 to pass therethrough. The first filter 41 is, for example, a ladder filter and has a plurality of (for example, four) series-arm resonators and a plurality of (for example, three) parallel-arm resonators. The first filter 41 is, for example, an acoustic wave filter. In the acoustic wave filter, each of the plurality of series-arm resonators and the plurality of parallel-arm resonators is configured by an acoustic wave resonator. The acoustic wave filter is, for example, a surface acoustic wave filter utilizing a surface acoustic wave. In the surface acoustic wave filter, each of the plurality of series-arm resonators and the plurality of parallel-arm resonators is, for example, a surface acoustic wave (SAW) resonator. Note that the first filter 41 is not limited to the SAW filter. As an alternative to the SAW filter, the first filter 41 may be a bulk acoustic wave (BAW) filter, for example. A resonator in the BAW filter is, for example, a film bulk acoustic resonator (FBAR) or a solidly mounted resonator (SMR). The BAW filter has a substrate. The substrate provided to the BAW filter is, for example, a silicon substrate.

The first filter 41 is electrically connected to the switch 20 with the first matching circuit 31 interposed therebetween. The first RF terminal 411 which is an input terminal of the first filter 41 is electrically connected to the first matching circuit 31, and the second RF terminal 412 which is an output terminal of the first filter 41 is electrically connected to the third matching circuit 51. The first filter 41 has the first ground terminal 413. The first ground terminal 413 is disposed between the first RF terminal 411 and the second RF terminal 412 in plan view in the thickness direction D1 of the mounting substrate 100.

The second filter 42 is a filter which allows a reception signal in a given frequency band received by the antenna 510 to pass therethrough, the given frequency band being different from the frequency band of the reception signal that the first filter 41 allows to pass therethrough. The second filter 42 is, for example, a ladder filter and has a plurality of (for example, four) series-arm resonators and a plurality of (for example, three) parallel-arm resonators. The second filter 42 is, for example, an acoustic wave filter. In the acoustic wave filter, each of the plurality of series-arm resonators and the plurality of parallel-arm resonators is configured by an acoustic wave resonator. The acoustic wave filter is, for example, a surface acoustic wave filter utilizing a surface acoustic wave. In the surface acoustic wave filter, each of the plurality of series-arm resonators and the plurality of parallel-arm resonators is, for example, a SAW resonator. Note that the second filter 42 is not limited to the SAW filter. As an alternative to the SAW filter, the second filter 42 may be a BAW filter, for example. A resonator in the BAW filter is, for example, an FBAR or an SMR. The BAW filter has a substrate. The substrate provided to the BAW filter is, for example, a silicon substrate.

The second filter 42 is electrically connected to the switch 20 with the second matching circuit 32 interposed therebetween. The third RF terminal 421 which is an input terminal of the second filter 42 is electrically connected to the second matching circuit 32, and the fourth RF terminal 422 which is an output terminal of the second filter 42 is electrically connected to the fourth matching circuit 52. The second filter 42 has the second ground terminal 423. The second ground terminal 423 is disposed between the third RF terminal 421 and the fourth RF terminal 422 in plan view in the thickness direction D1 of the mounting substrate 100.

The filter 40 further includes a third ground terminal 431 and a fourth ground terminal 432. The third ground terminal 431 and the fourth ground terminal 432 are each formed by a solder bump. The solder bump forming each of the third ground terminal 431 and the fourth ground terminal 432 is, for example, the alloy of copper and tin.

The third ground terminal 431 is disposed between the first RF terminal 411 and the third RF terminal 421, and the fourth ground terminal 432 is disposed between the second RF terminal 412 and the fourth RF terminal 422, in plan view in the thickness direction D1 of the mounting substrate 100. The first RF terminal 411 and the second RF terminal 412 are aligned in a first arrangement direction D2, and the third RF terminal 421 and the fourth RF terminal 422 are aligned in the first arrangement direction D2. The first RF terminal 411 and the third RF terminal 421 are aligned in a second arrangement direction D3 orthogonal to the first arrangement direction D2, and the second RF terminal 412 and the fourth RF terminal 422 are aligned in the second arrangement direction D3.

The third matching circuit 51 is electrically connected in a path between the first filter 41 and the first low-noise amplifier 61 and performs the impedance matching between the first filter 41 and the first low-noise amplifier 61. The fourth matching circuit 52 is electrically connected in a path between the second filter 42 and the second low-noise amplifier 62 and performs the impedance matching between the second filter 42 and the second low-noise amplifier 62.

The first low-noise amplifier 61 amplifies the reception signal which has passed through the first filter 41. An input terminal of the first low-noise amplifier 61 is electrically connected to the third matching circuit 51, and an output terminal of the first low-noise amplifier 61 is electrically connected to the signal output terminal 71.

The second low-noise amplifier 62 amplifies the reception signal which has passed through the second filter 42. An input terminal of the second low-noise amplifier 62 is electrically connected to the fourth matching circuit 52, and an output terminal of the second low-noise amplifier 62 is electrically connected to the signal output terminal 72.

Each of the signal output terminals 71 and 72 is connected to the RF signal processing circuit 502. That is, the first low-noise amplifier 61 is electrically connected to the RF signal processing circuit 502 with the signal output terminal 71 interposed therebetween. The second low-noise amplifier 62 is electrically connected to the RF signal processing circuit 502 with the signal output terminal 72 interposed therebetween.

The high-frequency module 1 further includes the mounting substrate 100, a plurality of (two in the drawing) external connection terminals 200, and the resin layer 120 (see FIG. 3).

The mounting substrate 100 has the first principal surface 101 and the second principal surface 102 opposed to each other in the thickness direction D1 of the mounting substrate 100.

The mounting substrate 100 is, for example, a printed wiring board, a low temperature co-fired ceramics (LTCC) substrate, a high temperature co-fired ceramics (HTCC) substrate, or a resin multilayer substrate. Here, the mounting substrate 100 is, for example, a multilayer substrate including a plurality of dielectric layers and a plurality of conductive layers and is a ceramic substrate. The plurality of dielectric layers and the plurality of conductive layers are laminated in the thickness direction D1 of the mounting substrate 100. The plurality of conductive layers are formed in given patterns determined for the respective layers. Each of the plurality of conductive layers includes one or more conductor parts in a plane orthogonal to the thickness direction D1 of the mounting substrate 100. The material of each conductive layer is copper, for example. The plurality of conductive layers include the ground layer 110. In the high-frequency module 1, one or more ground terminals included in the plurality of external connection terminals 200 and the ground layer 110 are electrically connected to each other with a via conductor or the like provided to the mounting substrate 100 interposed therebetween.

The mounting substrate 100 is not limited to the printed wiring board or the LTCC substrate and may be a wiring structure. The wiring structure is a multilayer structure, for example. The multilayer structure includes at least one insulating layer and at least one conductive layer. The insulating layer is formed in a given pattern. When the insulating layer includes a plurality of insulating layers, the plurality of insulating layers are formed in given patterns determined for the respective layers. The conductive layer is formed in a given pattern different from the given pattern of the insulating layer. When the conductive layer includes a plurality of conductive layers, the plurality of conductive layers are formed in given patterns determined for the respective layers. The conductive layer may include one or more redistribution parts. In the wiring structure, among two surfaces opposed to each other in a thickness direction of the multilayer structure, a first surface is the first principal surface 101 of the mounting substrate 100 and a second surface is the second principal surface 102 of the mounting substrate 100. The wiring structure may be an interposer, for example. The interposer may be an interposer using a silicon substrate or a multilayer substrate.

The first principal surface 101 and the second principal surface 102 of the mounting substrate 100 are separate from each other in the thickness direction D1 of the mounting substrate 100 and intersect with the thickness direction D1 of the mounting substrate 100. Although the first principal surface 101 of the mounting substrate 100 is, for example, orthogonal to the thickness direction D1 of the mounting substrate 100, it may include, for example, a side surface of the conductor part, as a surface which is not orthogonal to the thickness direction D1. Moreover, although the second principal surface 102 of the mounting substrate 100 is, for example, orthogonal to the thickness direction D1 of the mounting substrate 100, it may include, for example, a side surface of the conductor part, as a surface which is not orthogonal to the thickness direction D1. Further, the first principal surface 101 and the second principal surface 102 of the mounting substrate 100 may have minute or extremely small unevenness, a concave portion, or a convex portion. When seen in plan view in the thickness direction D1 of the mounting substrate 100, although the mounting substrate 100 has a rectangular shape, the shape is not limited to this and it may have a square shape, for example.

The high-frequency module 1 includes, as the plurality of electronic components, the switch 20, the first matching circuit 31, the second matching circuit 32, the filter 40, the third matching circuit 51, the fourth matching circuit 52, the first low-noise amplifier 61, and the second low-noise amplifier 62.

Each of the plurality of electronic components of the high-frequency module 1 is mounted on the first principal surface 101 or the second principal surface 102 of the mounting substrate 100. In Embodiment 1, each of the plurality of electronic components of the high-frequency module 1 is mounted on the first principal surface 101.

The plurality of external connection terminals 200 are disposed at the second principal surface 102. In more detail, the plurality of external connection terminals 200 are disposed at the second principal surface 102 of the mounting substrate 100. Each of the plurality of external connection terminals 200 is a solder bump.

The plurality of external connection terminals 200 include the antenna terminal 10, the one or more ground terminals, and the signal output terminals 71 and 72. The one or more ground terminals are connected to the ground layer 110 of the mounting substrate 100 as described above. The ground layer 110 is a circuit ground of the high-frequency module 1, and the plurality of electronic components of the high-frequency module 1 include the electronic component connected to the ground layer 110.

The resin layer 120 covers, on the first principal surface 101 side of the mounting substrate 100, the plurality of electronic components disposed at the first principal surface 101 of the mounting substrate 100. Here, the resin layer 120 seals the plurality of electronic components disposed at the first principal surface 101 of the mounting substrate 100. The resin layer 120 includes resin (for example, epoxy resin). The resin layer 120 may include a filler in addition to the resin.

When the resin layer 120 seals the plurality of electronic components disposed at the first principal surface 101, the resin layer 120 also seals the first through-hole 115 and the second through-hole 116.

The mounting substrate 100 has the ground layer 110 on the first principal surface 101 of the mounting substrate 100 (see FIG. 2). The ground layer 110 is formed by copper. The first ground terminal 413, the second ground terminal 423, the third ground terminal 431, and the fourth ground terminal 432 are each connected to the ground layer 110. The ground layer 110 is not connected to the first RF terminal 411 or the second RF terminal 412. Similarly, the ground layer 110 is not connected to the third RF terminal 421 or the fourth RF terminal 422.

When the mounting substrate 100 is seen in the direction (second arrangement direction D3) orthogonal to the first arrangement direction D2 which is a direction connecting the first RF terminal 411 and the second RF terminal 412, at least a portion of the ground layer 110 is disposed between the first RF terminal 411 and the second RF terminal 412. When the mounting substrate 100 is seen in the direction (second arrangement direction D3) orthogonal to the first arrangement direction D2 which is a direction connecting the third RF terminal 421 and the fourth RF terminal 422, at least a portion of the ground layer 110 is disposed between the third RF terminal 421 and the fourth RF terminal 422. Moreover, when the mounting substrate 100 is seen in the direction (first arrangement direction D2) orthogonal to the second arrangement direction D3 which is a direction connecting the first RF terminal 411 and the third RF terminal 421, at least a portion of the ground layer 110 is disposed between the first RF terminal 411 and the third RF terminal 421. When the mounting substrate 100 is seen in the direction (first arrangement direction D2) orthogonal to the second arrangement direction D3 which is a direction connecting the second RF terminal 412 and the fourth RF terminal 422, at least a portion of the ground layer 110 is disposed between the second RF terminal 412 and the fourth RF terminal 422.

As illustrated in FIG. 2, the ground layer 110 has the plurality of (here, two) through-holes 115 (hereinafter, the first through-holes 115) in contact with the first ground terminal 413. In detail, as illustrated in FIG. 2, the ground layer 110 has a first portion 110a, a second portion 110b, and at least two (here, three) bridging parts 111 (hereinafter, first bridging parts 111). The first portion 110a is connected to the first ground terminal 413. When the second portion 110b is seen in the direction (second arrangement direction D3) orthogonal to the direction (first arrangement direction D2) connecting the first RF terminal 411 and the second RF terminal 412, the second portion 110b is disposed between the first RF terminal 411 and the second RF terminal 412. The at least two first bridging parts 111 form a portion of an edge of each of the first through-holes 115. That is, the ground layer 110 has the plurality of through-holes 115 (first through-holes 115) in contact with the first ground terminal 413.

Each of the at least two first bridging parts 111 has a first end 111a connected to the first portion 110a, and a second end 111b connected to the second portion 110b. A width of the first bridging part 111 narrows from the first end 111a toward the second end 111b among both ends of the first bridging part 111. In other words, in each of the at least two first bridging parts 111, a width W1 of the second end 111b of the first bridging part 111 is shorter than a diameter R1 of the first ground terminal 413. Here, for example, when the diameter R1 of the first ground terminal 413 is 100 μm, the width W1 of the second end 111b of the first bridging part 111 is 30 μm or larger and 50 μm or smaller. That is, a ratio of the width W1 to the diameter R1 is, for example, 0.3:1 or higher and 0.5:1 or lower.

Moreover, in this embodiment, two adjacent first bridging parts 111 among the three first bridging parts 111 are disposed such that the first through-hole 115 formed by the two first bridging parts 111 has a circular sector shape. Note that although in this embodiment the ground layer 110 has a plurality of first through-holes 115, the configuration is not limited to this. The ground layer 110 may have a single first through-hole 115. That is, it is only necessary that the ground layer 110 has a configuration that has one or more through-holes 115 (first through-holes 115) in contact with the first ground terminal 413.

As illustrated in FIG. 2, the ground layer 110 has the plurality of (here, two) through-holes 116 (hereinafter, the second through-holes 116) in contact with the second ground terminal 423. In detail, as illustrated in FIG. 2, the ground layer 110 has a third portion 110*c*, a fourth portion 110*d*, and at least two (here, three) bridging parts 112 (hereinafter, second bridging parts 112). The third portion 110*c* is connected to the second ground terminal 423. When the fourth portion 110*d* is seen in the direction (second arrangement direction D3) orthogonal to the direction (first arrangement direction D2) connecting the third RF terminal 421 and the fourth RF terminal 422, the fourth portion 110*d* is disposed between the third RF terminal 421 and the fourth RF terminal 422. The at least two second bridging parts 112 form a portion of an edge of each of the second through-holes 116. That is, the ground layer 110 has the plurality of through-holes 116 (second through-holes 116) in contact with the second ground terminal 423.

Each of the at least two second bridging parts 112 has a first end 112*a* connected to the third portion 110*c*, and a second end 112*b* connected to the fourth portion 110*d*. A width of the second bridging part 112 narrows from the first end 112*a* toward the second end 112*b* among both ends of the second bridging part 112. In other words, in each of the at least two second bridging parts 112, a width W2 of the second end 112*b* of the second bridging part 112 is shorter than a diameter R2 of the second ground terminal 423. Here, for example, when the diameter R2 of the second ground terminal 423 is 100 μm, the width W2 of the second end 112*b* of the second bridging part 112 is 30 μm or larger and 50 μm or smaller. That is, a ratio of the width W2 to the diameter R2 is, for example, 0.3:1 or higher and 0.5:1 or lower.

Moreover, in this embodiment, two adjacent second bridging parts 112 among the three second bridging parts 112 are disposed such that the second through-hole 116 formed by the two second bridging parts 112 has a circular sector shape. Note that although in this embodiment the ground layer 110 has a plurality of second through-holes 116, the configuration is not limited to this. The ground layer 110 may have a single second through-hole 116. That is, it is only necessary that the ground layer 110 has a configuration that has one or more through-holes 116 (second through-holes 116) in contact with the second ground terminal 423.

As illustrated in FIG. 2, the ground layer 110 has a through-hole 117 (hereinafter, a third through-hole 117) in contact with the third ground terminal 431. In detail, as illustrated in FIG. 2, the ground layer 110 has a fifth portion 110*e*, a sixth portion 110*f*, and at least two (here, two) bridging parts 113 (hereinafter, third bridging parts 113). The fifth portion 110*e* is connected to the third ground terminal 431. When the sixth portion 110*f* is seen in the direction (first arrangement direction D2) orthogonal to the direction (second arrangement direction D3) connecting the first RF terminal 411 and the third RF terminal 421, the sixth portion 110*f* is disposed between the first RF terminal 411 and the third RF terminal 421. The at least two third bridging parts 113 form a portion of an edge of the third through-hole

117. That is, the ground layer 110 has one or more through-holes 117 (third through-holes 117) in contact with the third ground terminal 431.

Each of the at least two third bridging parts 113 has a first end 113*a* connected to the fifth portion 110*e*, and a second end 113*b* connected to the sixth portion 110*f*. A width of the third bridging part 113 narrows from the first end 113*a* toward the second end 113*b* among both ends of the third bridging part 113. In other words, in each of the at least two third bridging parts 113, a width W3 of the second end 113*b* of the third bridging part 113 is shorter than a diameter R3 of the third ground terminal 431. Here, for example, when the diameter R3 of the third ground terminal 431 is 100 μm, the width W3 of the second end 113*b* of the third bridging part 113 is 30 μm or larger and 50 μm or smaller. That is, a ratio of the width W3 to the diameter R3 is, for example, 0.3:1 or higher and 0.5:1 or lower.

Moreover, in this embodiment, the two third bridging parts 113 are disposed such that the third through-hole 117 formed by the two third bridging parts 113 has a circular sector shape.

As illustrated in FIG. 2, the ground layer 110 has a through-hole 118 (hereinafter, a fourth through-hole 118) in contact with the fourth ground terminal 432. In detail, as illustrated in FIG. 2, the ground layer 110 has a seventh portion 110*g*, an eighth portion 110*h*, and at least two (here, two) bridging parts 114 (hereinafter, fourth bridging parts 114). The seventh portion 110*g* is connected to the fourth ground terminal 432. When the eighth portion 110*h* is seen in the direction (first arrangement direction D2) orthogonal to the direction (second arrangement direction D3) connecting the second RF terminal 412 and the fourth RF terminal 422, the eighth portion 110*h* is disposed between the second RF terminal 412 and the fourth RF terminal 422. The at least two fourth bridging parts 114 form a portion of an edge of the fourth through-hole 118. That is, the ground layer 110 has one or more through-holes 118 (fourth through-holes 118) in contact with the fourth ground terminal 432.

Each of the at least two fourth bridging parts 114 has a first end 114*a* connected to the seventh portion 110*g*, and a second end 114*b* connected to the eighth portion 110*h*. A width of the fourth bridging part 114 narrows from the first end 114*a* toward the second end 114*b* among both ends of the fourth bridging part 114. In other words, in each of the at least two fourth bridging parts 114, a width W4 of the second end 114*b* of the fourth bridging part 114 is shorter than a diameter R4 of the fourth ground terminal 432. Here, for example, when the diameter R4 of the fourth ground terminal 432 is 100 μm, the width W4 of the second end 114*b* of the fourth bridging part 114 is 30 μm or larger and 50 μm or smaller. That is, a ratio of the width W4 to the diameter R4 is, for example, 0.3:1 or higher and 0.5:1 or lower.

Moreover, in this embodiment, the two fourth bridging parts 114 are disposed such that the fourth through-hole 118 formed by the two fourth bridging parts 114 has a circular sector shape.

Further, in plan view in the thickness direction D1 of the mounting substrate 100, the ground layer 110 overlaps a wiring path 130 which is wiring provided inside the mounting substrate 100 and connected to the first RF terminal 411 which is an input terminal of the first filter 41 (see FIG. 3). The wiring path 130 connected to the first RF terminal 411 is connected to the first matching circuit 31.

Moreover, in plan view in the thickness direction D1 of the mounting substrate 100, the ground layer 110 overlaps wiring (not illustrated) which is wiring provided inside the mounting substrate 100 and connected to the third RF terminal 421 which is an input terminal of the second filter 42. The wiring connected to the third RF terminal 421 is connected to the second matching circuit 32.

(3) Effects

As described above, the high-frequency module 1 of this embodiment includes the mounting substrate 100 and the filter 40. The mounting substrate 100 has the first principal surface 101 and the second principal surface 102 opposed to each other. The filter 40 is disposed at the first principal surface 101 of the mounting substrate 100 and allows a high-frequency signal to pass therethrough. The filter 40 includes the first RF terminal 411, the second RF terminal 412, and the ground terminal 413. The ground terminal 413 is located between the first RF terminal 411 and the second RF terminal 412 in plan view in the thickness direction D1 of the mounting substrate 100. The mounting substrate 100 has the ground layer 110 on the first principal surface 101. When the mounting substrate 100 is seen in the direction (second arrangement direction D3) orthogonal to the direction (for example, the first arrangement direction D2) connecting the first RF terminal 411 and the second RF terminal 412, at least a portion of the ground layer 110 is disposed between the first RF terminal 411 and the second RF terminal 412. The ground terminal 413 is formed by a solder bump and connected to the ground layer 110. The ground layer 110 has the through-hole 115 (first through-hole 115) in contact with the ground terminal 413.

In this configuration, by providing the through-hole 115 to the ground layer 110, an amount of solder flowing out to the ground layer 110 can be reduced while the ground between the two RF terminals (the first RF terminal 411 and the second RF terminal 412) is strengthened. In other words, in plan view in the thickness direction of the mounting substrate, spread of solder to the ground layer 110 can be reduced.

Meanwhile, in a filter including a SAW filter (a filter in a comparative example), in order to reduce a resistance which is an L component from the filter to a ground layer, it is required to provide a layer where the filter of the comparative example is disposed (that is, a ground layer formed on a first principal surface of a mounting substrate). At this time, solder is used to connect the filter of the comparative example to the ground layer, and there is a possibility that the solder flows out to a surface of the ground layer. In other words, the solder may spread on the surface of the ground layer. Therefore, in order to prevent the solder from flowing out to the surface of the ground layer, it is considered to provide a resist to surround a periphery of a part in which the filter of the comparative example and the ground layer are connected. In a high-frequency module provided with the resist (a high-frequency module of the comparative example), solder having a thickness equal to or larger than a thickness of the resist is necessary in order to connect the filter of the comparative example to the ground layer. Therefore, providing the resist becomes a factor of preventing reduction in height of the filter of the comparative example, that is, reduction in height of the high-frequency module of the comparative example. Moreover, since the resist forms a concave portion at the part in which the filter of the comparative example and the ground layer are connected, there is a high possibility that foreign matter remains in the concave portion. Thus, mounting failure may be caused between the filter of the comparative example and the ground layer.

On the other hand, in the high-frequency module 1 in this embodiment, since the ground layer 110 is provided with the through-hole 115, a resist is not required unlike with the high-frequency module of the comparative example. Therefore, reduction in height of the filter 40, that is, reduction in height of the high-frequency module 1 can be achieved. Furthermore, since a concave portion due to the resist is not formed in the high-frequency module 1, a possibility of causing mounting failure between the filter 40 and the ground layer 110 can be lowered.

Moreover, since connecting condition of the first ground terminal 413 to the ground can be strengthened by connecting the first ground terminal 413 to the ground layer 110, the isolation between the first RF terminal 411 and the second RF terminal 412 can be improved.

Moreover, since connecting condition of the second ground terminal 423 to the ground can be strengthened by connecting the second ground terminal 423 to the ground layer 110, the isolation between the third RF terminal 421 and the fourth RF terminal 422 can be improved.

Moreover, since connecting condition of the third ground terminal 431 to the ground can be strengthened by connecting the third ground terminal 431 to the ground layer 110, the isolation between the first RF terminal 411 and the third RF terminal 421 can be improved.

Further, since connecting condition of the fourth ground terminal 432 to the ground can be strengthened by connecting the fourth ground terminal 432 to the ground layer 110, the isolation between the second RF terminal 412 and the fourth RF terminal 422 can be improved.

(4) Modifications

Below, modifications according to this embodiment are described.

(4.1) Modification 1

Although in the embodiment described above the ground layer 110 has the through-holes 115 to 118, the configuration is not limited to this.

In Modification 1, the mounting substrate 100 has the ground layer 110 on the first principal surface 101. The ground layer 110 has the first portion 110a, the second portion 110b, and the at least two bridging parts 111 (first bridging parts 111). The first portion 110a is connected to the first ground terminal 413. When the second portion 110b is seen in the direction (second arrangement direction D3) orthogonal to the direction (first arrangement direction D2) connecting the first RF terminal 411 and the second RF terminal 412, the second portion 110b is disposed between the first RF terminal 411 and the second RF terminal 412. The at least two bridging parts 111 (first bridging parts 111) connect the first portion 110a to the second portion 110b. The first ground terminal 413 is formed by a solder bump and is connected to each of the at least two first bridging parts 111. By each of the at least two first bridging parts 111 being connected to the first ground terminal 413, one or more through-holes 115 (first through-holes 115) are formed.

The ground layer 110 has the third portion 110c, the fourth portion 110d, and the at least two bridging parts 112 (second bridging parts 112). The third portion 110c is connected to the second ground terminal 423. When the fourth portion 110d is seen in the direction (second arrangement direction D3) orthogonal to the direction (first arrangement direction D2) connecting the third RF terminal 421 and the fourth RF terminal 422, the fourth portion 110d is disposed between the third RF terminal 421 and the fourth RF terminal 422. The at least two bridging parts 112 (second bridging parts 112) connect the third portion 110c to the fourth portion 110d. The second ground terminal 423 is formed by a solder bump and is connected to each of the at least two second bridging parts 112. By each of the at least two second bridging parts 112 being connected to the second ground terminal 423, one or more through-holes 116 (second through-holes 116) are formed.

The ground layer 110 has the fifth portion 110e, the sixth portion 110f, and the at least two bridging parts 113 (third bridging parts 113). The fifth portion 110e is connected to the third ground terminal 431. When the sixth portion 110f is seen in the direction (first arrangement direction D2) orthogonal to the direction (second arrangement direction D3) connecting the first RF terminal 411 and the third RF terminal 421, the sixth portion 110f is disposed between the first RF terminal 411 and the third RF terminal 421. The at least two bridging parts 113 (third bridging parts 113) connect the fifth portion 110e to the sixth portion 110f. The third ground terminal 431 is formed by a solder bump and is connected to each of the at least two third bridging parts 113. By each of the at least two third bridging parts 113 being connected to the third ground terminal 431, one or more through-holes 117 (third through-holes 117) are formed.

The ground layer 110 has the seventh portion 110g, the eighth portion 110h, and the at least two bridging parts 114 (fourth bridging parts 114). The seventh portion 110g is connected to the fourth ground terminal 432. When the eighth portion 110h is seen in the direction (first arrangement direction D2) orthogonal to the direction (second arrangement direction D3) connecting the second RF terminal 412 and the fourth RF terminal 422, the eighth portion 110h is disposed between the second RF terminal 412 and the fourth RF terminal 422. The at least two bridging parts 114 (fourth bridging parts 114) connect the seventh portion 110g to the eighth portion 110h. The fourth ground terminal 432 is formed by a solder bump and is connected to each of the at least two fourth bridging parts 114. By each of the at least two fourth bridging parts 114 being connected to the fourth ground terminal 432, one or more through-holes 118 (fourth through-holes 118) are formed.

In each of the first bridging parts 111, the width W1 of the portion (second end 111b) connected to the ground layer 110 is shorter than the diameter R1 of the first ground terminal 413. In each of the second bridging parts 112, the width W2 of the portion (second end 112b) connected to the ground layer 110 is shorter than the diameter R2 of the second ground terminal 423. In each of the third bridging parts 113, the width W3 of the portion (second end 113b) connected to the ground layer 110 is shorter than the diameter R3 of the third ground terminal 431. In each of the fourth bridging parts 114, the width W4 of the portion (second end 114b) connected to the ground layer 110 is shorter than the diameter R4 of the fourth ground terminal 432.

(4.2) Modification 2

Although in the embodiment described above each of the plurality of electronic components included in the high-frequency module 1 is mounted on the first principal surface 101 of the mounting substrate 100, the configuration is not limited to this.

At least one of the plurality of electronic components may be provided to the second principal surface 102 of the mounting substrate 100. Below, a high-frequency module 1A according to Modification 2 is described with reference to FIG. 4. Note that in Modification 2 the same reference characters are given to components similar to those of the high-frequency module 1 according to the embodiment, and the description thereof is omitted suitably.

As with the high-frequency module 1 in the embodiment, the high-frequency module 1A includes, as the plurality of electronic components, the switch 20, the first matching circuit 31, the second matching circuit 32, the filter 40, the third matching circuit 51, the fourth matching circuit 52, the first low-noise amplifier 61, and the second low-noise amplifier 62, which are illustrated in FIG. 1. As with the high-frequency module 1 in the embodiment, the high-frequency module 1A includes the signal output terminals 71 and 72 illustrated in FIG. 1.

Figure 4:
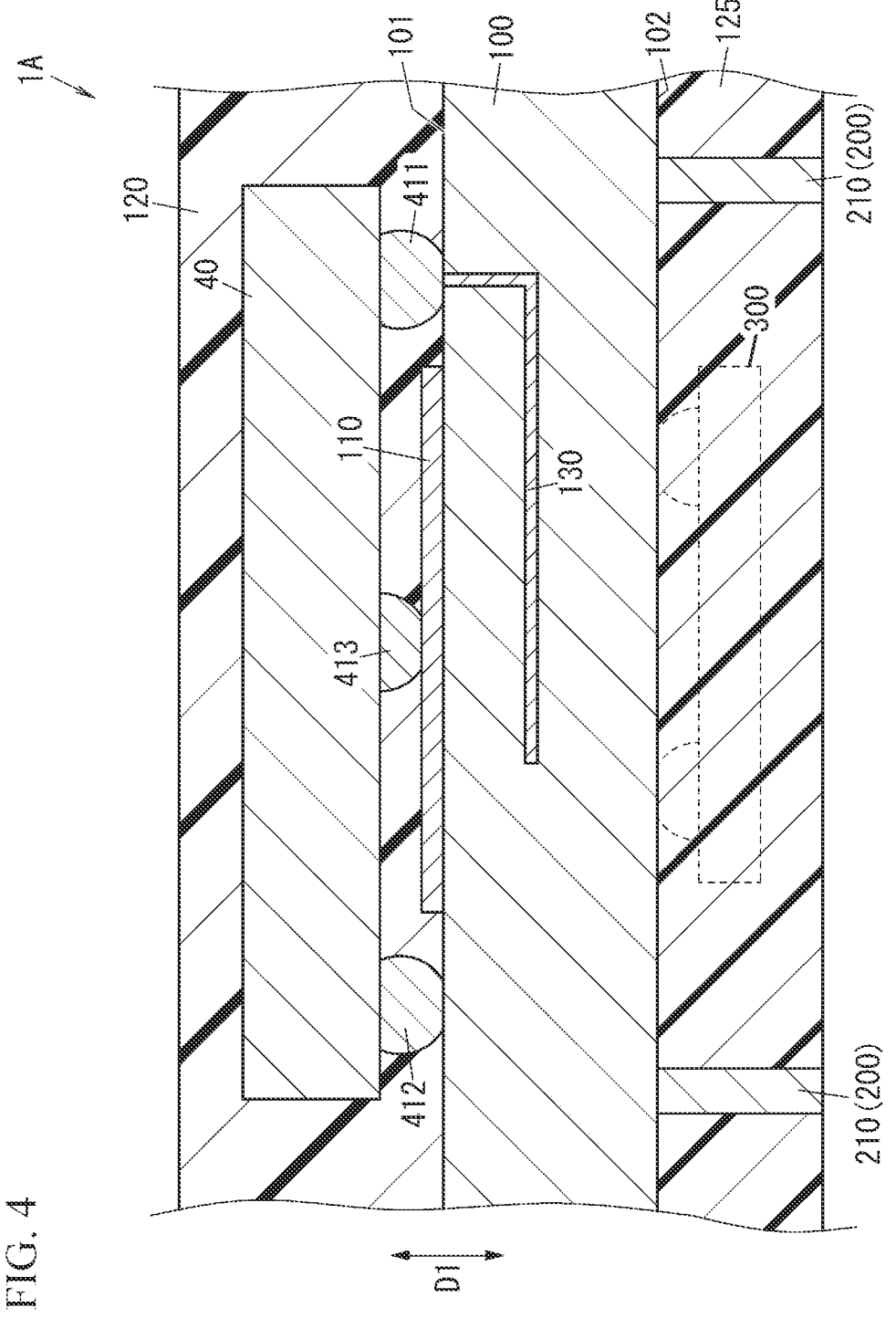
FIG. 4 is a sectional view of a high-frequency module according to Modification 2 of the embodiment.

As illustrated in FIG. 4, the high-frequency module 1A further includes the mounting substrate 100, a plurality of (two in the drawing) external connection terminals 210 as the external connection terminals 200, a first resin layer 120 as the resin layer 120, and a second resin layer 125. Note that in FIG. 4, as with FIG. 3, the illustration of the conductor part and a plurality of wiring lines configured by via conductors and the like, of the mounting substrate 100 is omitted.

The plurality of external connection terminals 210 are configured by pillar-shaped electrodes and include the antenna terminal 10, one or more ground terminals, and the signal output terminals 71 and 72. The one or more ground terminals are connected to the ground layer 110 provided on the first principal surface 101 of the mounting substrate 100 as described above.

The switch 20, the first low-noise amplifier 61, and the second low-noise amplifier 62 are formed into one chip to form a switch IC 300 (see FIG. 4). The switch IC 300 is disposed at the second principal surface 102 of the mounting substrate 100 (see FIG. 4).

The second resin layer 125 is disposed on the second principal surface 102 of the mounting substrate 100. The second resin layer 125 covers, on the second principal surface 102 side of the mounting substrate 100, a portion of each of the plurality of electronic components and the plurality of external connection terminals 210 mounted on the second principal surface 102 of the mounting substrate 100. The second resin layer 125 is formed such that a tip-end surface of each of the plurality of external connection terminals 210 is exposed. The second resin layer 125 includes resin (for example, epoxy resin). The second resin layer 125 may include a filler in addition to the resin. The material of the second resin layer 125 may be the same as or different from the material of the first resin layer 120.

Also in Modification 2, by providing the through-hole 115 to the ground layer 110, an amount of solder flowing out to the ground layer 110 can be reduced while the ground between the two RF terminals (the first RF terminal 411 and the second RF terminal 412) is strengthened.

(4.3) Modification 3

Figure 5:
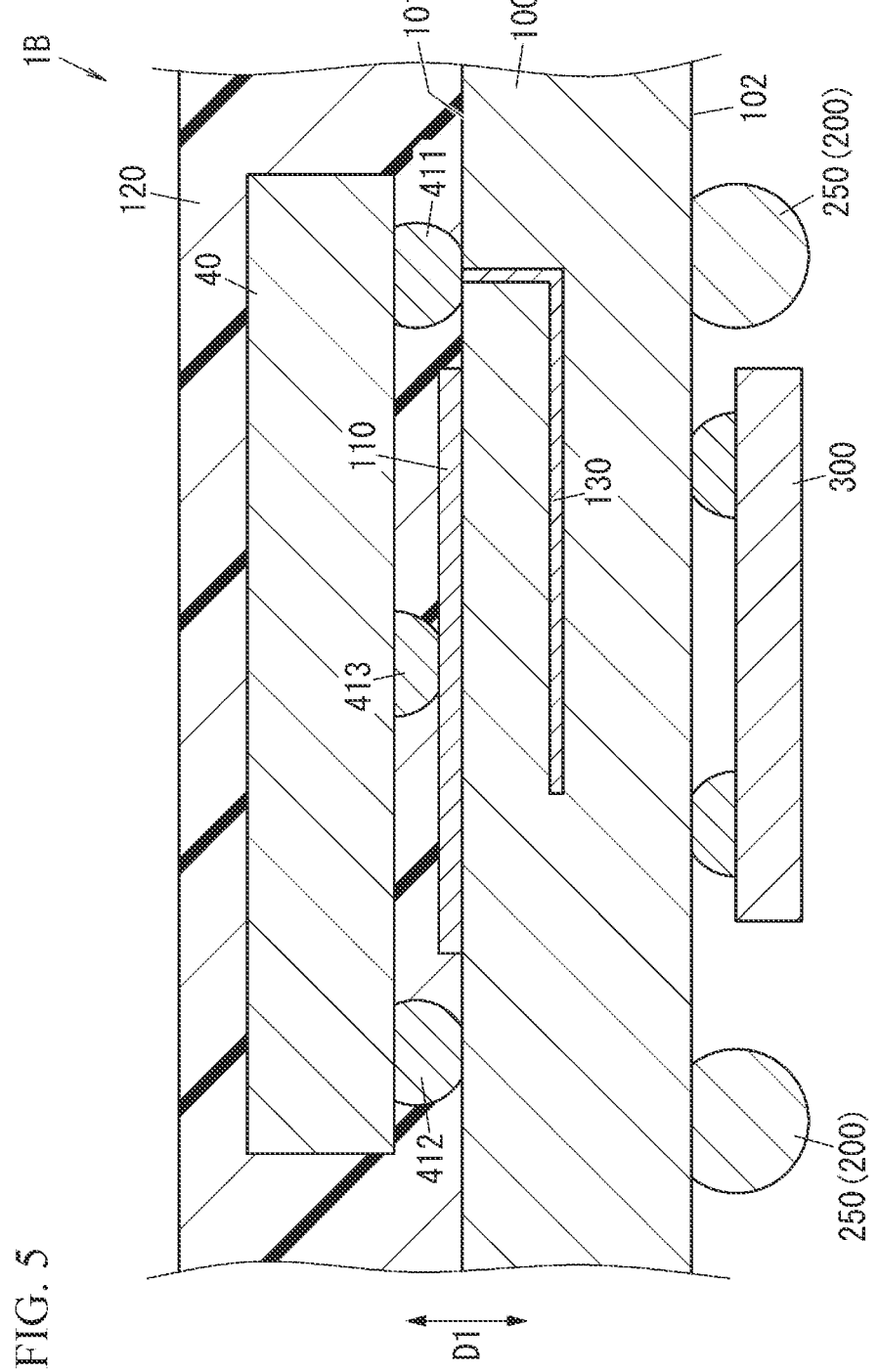
FIG. 5 is a sectional view of a high-frequency module according to Modification 3 of the embodiment.

A high-frequency module 1B according to Modification 3 is described with reference to FIG. 5. Regarding the high-frequency module 1B according to Modification 3, the same reference characters are given to components similar to those of the high-frequency module 1A according to Modification 2, and the description thereof is omitted suitably.

The high-frequency module 1B according to Modification 3 is different from the high-frequency module 1A according to Modification 2 in that the external connection terminals 210 as the plurality of external connection terminals 200 are ball bumps 250. Moreover, the high-frequency module 1B according to Modification 3 is different from the high-frequency module 1A according to Modification 2 in that it is not provided with the second resin layer 125 of the high-frequency module 1A in Modification 2. The high-frequency module 1B according to Modification 3 may include an underfill part provided to a gap between the switch IC 300 and the second principal surface 102 of the mounting substrate 100. Note that in FIG. 5, as with FIG. 3, the illustration of the conductor part and a plurality of wiring lines configured by via conductors and the like, of the mounting substrate 100 is omitted.

The material of the ball bump 250 constituting each of the plurality of external connection terminals 210 is, for example, gold, copper, or solder.

The plurality of external connection terminals 210 may be the combination of the external connection terminal 210 configured by the ball bump 250 and the external connection terminal 210 configured by the pillar-shaped electrode.

Also in Modification 3, by providing the through-hole 115 to the ground layer 110, an amount of solder flowing out to the ground layer 110 can be reduced while the ground between the two RF terminals (the first RF terminal 411 and the second RF terminal 412) is strengthened.

(4.4) Modification 4

In the embodiment described above, the width of the first bridging part 111 narrows as separating from the first ground terminal 413. That is, the width narrows from the first end 111a of the first bridging part 111 toward the second end 111b of the first bridging part 111. However, the first bridging part 111 is not limited to have this configuration.

The width of the first bridging part 111 may be constant between the first end 111a and the second end 111b.

Moreover, similarly, the width of the second bridging part 112 may be constant between the first end 112a and the second end 112b. The width of the third bridging part 113 may be constant between the first end 113a and the second end 113b. The width of the fourth bridging part 114 may be constant between the first end 114a and the second end 114b.

Note that "being constant" in this disclosure includes not only being completely constant, but also falling within a permissible margin of error. The permissible margin of error is ±10%, for example.

(4.5) Modification 5

The high-frequency module 1 according to this embodiment may have a function to receive a reception signal received by the antenna 510 and output the signal to the RF signal processing circuit 502, and a function to receive a high-frequency transmission signal outputted from the RF signal processing circuit 502 and output the signal to the antenna 510 or the like. That is, the high-frequency module 1 according to this embodiment may be a high-frequency module of a transmission and reception system. In this case, the high-frequency module of the transmission and reception system includes, in addition to the plurality of low-noise amplifiers (the first low-noise amplifier 61 and the second low-noise amplifier 62), a plurality of power amplifiers which amplify the transmission signal.

Further, the transmission-and-reception high-frequency module includes, in addition to the filter 40, transmission filters (a first transmission filter and a second transmission filter) which allow a transmission signal in a given frequency band outputted from the signal processing circuit 501 to pass therethrough and output the signal to the antenna terminal 10.

The high-frequency module of the transmission and reception system includes a fifth matching circuit which is electrically connected to the first transmission filter and performs the impedance matching between one of the plurality of power amplifiers and the first transmission filter.

The high-frequency module of the transmission and reception system includes a sixth matching circuit which is electrically connected to the second transmission filter and performs the impedance matching between another amplifier, which is different from the above-mentioned power amplifier, of the plurality of power amplifiers and the second transmission filter.

Furthermore, the high-frequency module 1 according to Modification 5 can amplify the transmission signal (high-frequency signal) inputted from the signal processing circuit 501 and output the signal to the antenna 510.

The transmission signal flows through the power amplifier, the fifth matching circuit (or the sixth matching circuit), the first transmission filter (or the second transmission filter), the switch 20, and the antenna terminal 10, in this order.

The first transmission filter and the second transmission filter are disposed at the first principal surface 101 of the mounting substrate 100 and allow the high-frequency signal (transmission signal) outputted from the signal processing circuit 501 to pass therethrough.

The first transmission filter is a filter which allows a transmission signal in a given frequency band outputted from the signal processing circuit 501 to pass therethrough. The first transmission filter is, for example, a ladder filter and has a plurality of (for example, four) series-arm resonators and a plurality of (for example, three) parallel-arm resonators. The first transmission filter is, for example, an acoustic wave filter. In the acoustic wave filter, each of the plurality of series-arm resonators and the plurality of parallel-arm resonators is configured by an acoustic wave resonator. The acoustic wave filter is, for example, a surface acoustic wave filter utilizing a surface acoustic wave. In the surface acoustic wave filter, each of the plurality of series-arm resonators and the plurality of parallel-arm resonators is, for example, a SAW resonator. Note that the first transmission filter is not limited to the SAW filter. As an alternative to the SAW filter, the first transmission filter may be a BAW filter, for example. A resonator in the BAW filter is, for example, an FBAR or an SMR. The BAW filter has a substrate. The substrate provided to the BAW filter is, for example, a silicon substrate.

The first transmission filter has an input terminal (fifth RF terminal), an output terminal (sixth RF terminal), and a fifth ground terminal. The fifth ground terminal is disposed between the fifth RF terminal and the sixth RF terminal in plan view in the thickness direction D1 of the mounting substrate 100. The fifth ground terminal is formed by a solder bump. The solder bump forming the fifth ground terminal is, for example, the alloy of copper and tin.

The second transmission filter is a filter which allows a transmission signal in a given frequency band outputted from the signal processing circuit 501 to pass therethrough. The second transmission filter is, for example, a ladder filter and has a plurality of (for example, four) series-arm resonators and a plurality of (for example, three) parallel-arm resonators. The second transmission filter is, for example, an acoustic wave filter. In the acoustic wave filter, each of the plurality of series-arm resonators and the plurality of parallel-arm resonators is configured by an acoustic wave resonator. The acoustic wave filter is, for example, a surface acoustic wave filter utilizing a surface acoustic wave. In the surface acoustic wave filter, each of the plurality of series-arm resonators and the plurality of parallel-arm resonators is, for example, a SAW resonator. Note that the second transmission filter is not limited to the SAW filter. As an alternative to the SAW filter, the second transmission filter may be a BAW filter, for example. A resonator in the BAW filter is, for example, an FBAR or an SMR. The BAW filter has a substrate. The substrate provided to the BAW filter is, for example, a silicon substrate.

The second transmission filter has an input terminal (seventh RF terminal), an output terminal (eighth RF terminal), and a sixth ground terminal. The sixth ground terminal is disposed between the seventh RF terminal and the eighth RF terminal in plan view in the thickness direction D1 of the mounting substrate 100. The sixth ground terminal is formed by a solder bump. The solder bump forming the sixth ground terminal is, for example, the alloy of copper and tin.

In a case where the first transmission filter and the second transmission filter are a transmission filter formed into one chip, the transmission filter further includes a seventh ground terminal and an eighth ground terminal. The seventh ground terminal and the eighth ground terminal are each formed by a solder bump. The solder bump forming each of the seventh ground terminal and the eighth ground terminal is, for example, the alloy of copper and tin.

The mounting substrate 100 of Modification 5 has the ground layer 110 on the first principal surface 101 of the mounting substrate 100 of Modification 5. The ground layer 110 is formed by copper, for example. The fifth ground terminal, the sixth ground terminal, the seventh ground terminal, and the eighth ground terminal are each connected to the ground layer 110. The ground layer 110 is not connected to the fifth RF terminal or the sixth RF terminal. Similarly, the ground layer 110 is not connected to the seventh RF terminal or the eighth RF terminal.

When the mounting substrate 100 of Modification 5 is seen in the direction (second arrangement direction D3) orthogonal to the direction (for example, the first arrangement direction D2) connecting the fifth RF terminal and the sixth RF terminal, at least a portion of the ground layer 110 is disposed between the fifth RF terminal and the sixth RF terminal. When the mounting substrate 100 is seen in the direction (second arrangement direction D3) orthogonal to the direction (for example, the first arrangement direction D2) connecting the seventh RF terminal and the eighth RF terminal, at least a portion of the ground layer 110 is disposed between the seventh RF terminal and the eighth RF terminal. Moreover, when the mounting substrate 100 is seen in the direction (first arrangement direction D2) orthogonal to the direction (for example, the second arrangement direction D3) connecting the fifth RF terminal and the seventh RF terminal, at least a portion of the ground layer 110 is disposed between the fifth RF terminal and the seventh RF terminal. When the mounting substrate 100 is seen in the direction (first arrangement direction D2) orthogonal to the direction (for example, the second arrangement direction D3) connecting the sixth RF terminal and the eighth RF terminal, at least a portion of the ground layer 110 is disposed between the sixth RF terminal and the eighth RF terminal.

The ground layer 110 has one or more through-holes (hereinafter, fifth through-holes) in contact with the fifth ground terminal. In detail, the ground layer 110 has at least two bridging parts (hereinafter, fifth bridging parts) forming a portion of an edge of the fifth through-hole. That is, the ground layer 110 has one or more fifth through-holes in contact with the fifth ground terminal. Among both ends of each of the at least two fifth bridging parts, a first end is connected to the fifth ground terminal. A width of the fifth bridging part narrows from the first end toward a second end among both ends of the fifth bridging part. In other words, in each of the at least two fifth bridging parts, a width of the second end of the fifth bridging part is shorter than a diameter of the fifth ground terminal.

The ground layer 110 has one or more through-holes (hereinafter, sixth through-holes) in contact with the sixth ground terminal. In detail, the ground layer 110 has at least two bridging parts (hereinafter, sixth bridging parts) forming a portion of an edge of the sixth through-hole. That is, the ground layer 110 has one or more sixth through-holes in contact with the sixth ground terminal. Among both ends of each of the at least two sixth bridging parts, a first end is connected to the sixth ground terminal. A width of the sixth bridging part narrows from the first end toward a second end among both ends of the sixth bridging part. In other words, in each of the at least two sixth bridging parts, a width of the second end of the sixth bridging part is shorter than a diameter of the sixth ground terminal.

The ground layer 110 has one or more through-holes (hereinafter, seventh through-holes) in contact with the seventh ground terminal. In detail, the ground layer 110 has at least two bridging parts (hereinafter, seventh bridging parts) forming a portion of an edge of the seventh through-hole. That is, the ground layer 110 has one or more seventh through-holes in contact with the seventh ground terminal. Among both ends of each of the at least two seventh bridging parts, a first end is connected to the seventh ground terminal. A width of the seventh bridging part narrows from the first end toward a second end among both ends of the seventh bridging part. In other words, in each of the at least two seventh bridging parts, a width of the second end of the seventh bridging part is shorter than a diameter of the seventh ground terminal.

The ground layer 110 has one or more through-holes (hereinafter, eighth through-holes) in contact with the eighth ground terminal. In detail, the ground layer 110 has at least two bridging parts (hereinafter, eighth bridging parts) forming a portion of an edge of the eighth through-hole. That is, the ground layer 110 has one or more eighth through-holes in contact with the eighth ground terminal. Among both ends of each of the at least two eighth bridging parts, a first end is connected to the eighth ground terminal. A width of the eighth bridging part narrows from the first end toward a second end among both ends of the eighth bridging part. In other words, in each of the at least two eighth bridging parts, a width of the second end of the eighth bridging part is shorter than a diameter of the eighth ground terminal.

Further, in plan view in the thickness direction D1 of the mounting substrate 100 of Modification 5, the ground layer 110 overlaps a wiring path which is wiring provided inside the mounting substrate 100 and connected to the fifth RF terminal which is an input terminal of the first transmission filter.

Moreover, in plan view in the thickness direction D1 of the mounting substrate 100 of Modification 5, the ground layer 110 overlaps a wiring path which is wiring provided inside the mounting substrate 100 and connected to the seventh RF terminal which is an input terminal of the second transmission filter.

Moreover, the high-frequency module 1 according to the embodiment may be a high-frequency module which performs transmission.

(4.6) Modification 6

Although in the embodiment described above the filter 40 has a configuration in which two filters (the first filter 41 and the second filter 42) are formed into one chip, the configuration is not limited to this. The filter 40 may be configured by a single filter.

Moreover, although the filter 40 is configured by a SAW filter, the configuration is not limited to this. When the high-frequency module 1 includes the function of the transmission system, the filter 40 may be any filter as long as it is connected to the ground layer 110 by a solder bump, and the filter 40 may be an integrated passive device (IPD), for example. The IPD is an LC filter provided to a transmission path of the high-frequency module 1 and is, for example, an LC filter for harmonic rejection provided to the transmission path including the first filter 41 (or the second filter 42) in the high-frequency module 1.

(4.7) Modification 7

The filter 40 is not limited to include a transmission filter or a reception filter and may include a duplexer.

Summary

As described above, the high-frequency module (1; 1A; 1B) of a first aspect includes the mounting substrate (100) and the filter (40). The mounting substrate (100) has the first principal surface (101) and the second principal surface (102) opposed to each other. The filter (40) is disposed at the first principal surface (101) of the mounting substrate (100) and allows a high-frequency signal to pass therethrough. The filter (40) includes the first RF terminal (411), the second RF terminal (412), and the ground terminal (413). The ground terminal (413) is located between the first RF terminal (411) and the second RF terminal (412) in plan view in the thickness direction (D1) of the mounting substrate (100). The mounting substrate (100) has the ground layer (110) on the first principal surface (101). When the mounting substrate (100) is seen in the direction (second arrangement direction D3) orthogonal to the direction (for example, the first arrangement direction D2) connecting the first RF terminal (411) and the second RF terminal (412), at least a portion of the ground layer (110) is disposed between the first RF terminal (411) and the second RF terminal (412). The ground terminal (413) is formed by a solder bump and connected to the ground layer (110). The ground layer (110) has the through-hole (115) in contact with the ground terminal (413).

In this configuration, an amount of solder for the connection between the ground terminal (413) and the ground layer (110) to flow out to the ground layer (110) can be reduced while the ground between the two RF terminals (the first RF terminal 411 and the second RF terminal 412) is strengthened. Moreover, the isolation between the first RF terminal (411) and the second RF terminal (412) can be improved. That is, the characteristic degradation of the filter (40) can be suppressed.

In the high-frequency module (1; 1A; 1B) of a second aspect, in the first aspect, the ground layer (110) has the first portion (110a), the second portion (110b), and the at least two bridging parts (111). The first portion (110a) is connected to the ground terminal (413). The second portion (110b) is disposed between the first RF terminal (411) and the second RF terminal (412) when seen in the direction (second arrangement direction D3) orthogonal to the direction (first arrangement direction D2) connecting the first RF terminal (411) and the second RF terminal (412). The at least two bridging parts (111) connect the first portion (110a) to the second portion (110b). The at least two bridging parts (111) form a portion of the edge of the through-hole (115).

In this configuration, the through-hole (115) can be provided to the ground layer (110) by the at least two bridging parts (111).

In the high-frequency module (1; 1A; 1B) of a third aspect, in the second aspect, each of the at least two bridging parts has the first end (111a) connected to the first portion (110a), and the second end (111b) connected to the second portion (110b). The width (W1) of the bridging part (111) narrows from the first end (111a) toward the second end (111b).

In this configuration, an amount of solder flowing out to the ground layer (110) can be reduced while the ground between the two RF terminals (the first RF terminal 411 and the second RF terminal 412) is strengthened.

In the high-frequency module (1; TA; 1B) of a fourth aspect, in any one of the first to third aspects, the through-hole (115) provided to the ground layer (110) includes a plurality of through-holes (115).

In this configuration, an amount of solder for the connection between the ground terminal (413) and the ground layer (110) to flow out to the ground layer (110) can be reduced. Further, the resistance which is the L component from the filter (40) to the ground layer (110) can be reduced.

In the high-frequency module (1; TA; 1B) of a fifth aspect, in any one of the first to fourth aspects, the filter (40) further includes the third RF terminal (421), the fourth RF terminal (422), and the second ground terminal (423) different from the first ground terminal (413) as the ground terminal (413). The second ground terminal (423) is disposed between the third RF terminal (421) and the fourth RF terminal (422) in plan view in the thickness direction (D1) of the mounting substrate (100). When the mounting substrate (100) is seen in the direction (second arrangement direction D3) orthogonal to the direction (first arrangement direction D2) connecting the third RF terminal (421) and the fourth RF terminal (422), at least a portion of the ground layer (110) is disposed between the third RF terminal (421) and the fourth RF terminal (422). The second ground terminal (423) is formed by a solder bump and connected to the ground layer (110). The ground layer (110) has the second through-hole (116) in contact with the second ground terminal (423) and different from the first through-hole (115) as the through-hole (115).

In this configuration, an amount of solder for the connection between the second ground terminal (423) and the ground layer (110) to flow out to the ground layer (110) can be reduced while the ground between the two RF terminals (the third RF terminal 421 and the fourth RF terminal 422) is strengthened. Moreover, the isolation between the third RF terminal (421) and the fourth RF terminal (422) can be improved. That is, the characteristic degradation of the filter (40) can be suppressed.

In the high-frequency module (1; 1A; 1B) of a sixth aspect, in the fifth aspect, the filter (40) further includes the third ground terminal (431) and the fourth ground terminal (432). The third ground terminal (431) is disposed between the first RF terminal (411) and the third RF terminal (421), and the fourth ground terminal (432) is disposed between the second RF terminal (412) and the fourth RF terminal (422), in plan view in the thickness direction (D1) of the mounting substrate (100). Each of the third ground terminal (431) and the fourth ground terminal (432) is formed by a solder bump and connected to the ground layer (110). When the mounting substrate (100) is seen in the direction (first arrangement direction D2) orthogonal to the direction (second arrangement direction D3) connecting the first RF terminal (411) and the third RF terminal (421), at least a portion of the ground layer (110) is disposed between the first RF terminal (411) and the third RF terminal (421). When the mounting substrate (100) is seen in the direction (first arrangement direction D2) orthogonal to the direction (second arrangement direction D3) connecting the second RF terminal (412) and the fourth RF terminal (422), at least a portion of the ground layer (110) is disposed between the second RF terminal (412) and the fourth RF terminal (422). The ground layer (110) further has the third through-hole (117) in contact with the third ground terminal (431) and the fourth through-hole (118) in contact with the fourth ground terminal (432).

In this configuration, an amount of solder for the connection between the third ground terminal (431) and the ground layer (110) to flow out to the ground layer (110) can be reduced while the ground between the two RF terminals (the first RF terminal 411 and the third RF terminal 421) is strengthened. An amount of solder for the connection between the fourth ground terminal (432) and the ground layer (110) to be flow out to the ground layer (110) can be reduced while the ground between the two RF terminals (the second RF terminal 412 and the fourth RF terminal 422) is strengthened. Moreover, the isolation between the first RF terminal (411) and the third RF terminal (421), and the isolation between the second RF terminal (412) and the fourth RF terminal (422) can be improved. That is, the characteristic degradation of the filter (40) can be suppressed.

In the high-frequency module (1; 1A; 1B) of a seventh aspect, in the sixth aspect, the first RF terminal (411) and the second RF terminal (412) are aligned in the first direction (first arrangement direction D2), and the third RF terminal (421) and the fourth RF terminal (422) are aligned in the first direction (first arrangement direction D2). The first RF terminal (411) and the third RF terminal (421) are aligned in the second direction (second arrangement direction D3) orthogonal to the first direction (first arrangement direction D2), and the second RF terminal (412) and the fourth RF terminal (422) are aligned in the second direction (second arrangement direction D3)

In this configuration, the isolation between the first RF terminal (411) and the fourth RF terminal (422), and the isolation between the second RF terminal (412) and the third RF terminal (421) can be improved.

In the high-frequency module (1; 1A; 1B) of an eighth aspect, in any one of the first to seventh aspects, the first RF terminal (411) is the input terminal which receives the high-frequency signal. In plan view in the thickness direction (D1) of the mounting substrate (100), the ground layer (110) overlaps the wiring path (130) provided inside the mounting substrate (100) and connected to the input terminal.

In this configuration, the isolation between the wiring path (130), and the first RF terminal (411) and the second RF terminal (412) can be improved.

The high-frequency module (1; 1A; 1B) of a ninth aspect includes the mounting substrate (100) and the filter (40). The mounting substrate (100) has the first principal surface (101)

and the second principal surface (102) opposed to each other. The filter (40) is disposed at the first principal surface (101) of the mounting substrate (100) and allows a high-frequency signal to pass therethrough. The filter (40) includes the first RF terminal (411), the second RF terminal (412), and the ground terminal (413). The ground terminal (413) is located between the first RF terminal (411) and the second RF terminal (412) in plan view in the thickness direction (D1) of the mounting substrate (100). The mounting substrate (100) has the ground layer (110) on the first principal surface (101). When the mounting substrate (100) is seen in the direction (second arrangement direction D3) orthogonal to the direction (first arrangement direction D2) connecting the first RF terminal (411) and the second RF terminal (412), at least a portion of the ground layer (110) is disposed between the first RF terminal (411) and the second RF terminal (412). The ground layer (110) has the first portion (110a), the second portion (110b), and the at least two bridging parts (111). The first portion (110a) is connected to the ground terminal (413). The second portion (110b) is disposed between the first RF terminal (411) and the second RF terminal (412) when seen in the direction (second arrangement direction D3) orthogonal to the direction (first arrangement direction D2) connecting the first RF terminal (411) and the second RF terminal (412). The at least two bridging parts (111) connect the first portion (110a) to the second portion (110b). The ground terminal (413) is formed by a solder bump and connected to each of the at least two bridging parts (111).

In this configuration, an amount of solder for the connection between the ground terminal (413) and the ground layer (110) to flow out to the ground layer (110) can be reduced while the ground between the two RF terminals (the first RF terminal 411 and the second RF terminal 412) is strengthened.

In the high-frequency module (1; 1A; 1B) of a tenth aspect, in the ninth aspect, in each of the at least two bridging parts (111), the width (W1) of the portion connected to the ground layer (110) is shorter than the diameter (R1) of the ground terminal (413).

In this configuration, an amount of solder flowing out to the ground layer (110) can be reduced while the ground between the two RF terminals (the first RF terminal 411 and the second RF terminal 412) is strengthened.

The communication device (500) of an eleventh aspect includes the high-frequency module (1; LA; 1B) of any one of the first to tenth aspects, and the signal processing circuit (501). The signal processing circuit (501) processes the high-frequency signal that passes through the high-frequency module (1; 1A; 1B).

In this configuration, an amount of solder for the connection between the ground terminal (413) and the ground layer (110) to flow out to the ground layer (110) can be reduced while the ground between the two RF terminals (the first RF terminal 411 and the second RF terminal 412) is strengthened.

1, 1A, 1B high-frequency module
10 antenna terminal
20 switch
21 common terminal
22, 23 selection terminal
31 first matching circuit
32 second matching circuit
40 filter
41 first filter
42 second filter
51 third matching circuit

52 fourth matching circuit
61 first low-noise amplifier
62 second low-noise amplifier
71, 72 signal output terminal
100 mounting substrate
101 first principal surface
102 second principal surface
110 ground layer
110*a* first portion
110*b* second portion
110*c* third portion
110*d* fourth portion
110*e* fifth portion
110*f* sixth portion
110*g* seventh portion
110*h* eighth portion
111 first bridging part (bridging part)
111*a*, 112*a*, 113*a*, 114*a* first end
111*b*, 112*b*, 113*b*, 114*b* second end
112 second bridging part (bridging part)
113 third bridging part (bridging part)
114 fourth bridging part (bridging part)
115 first through-hole (through-hole)
116 second through-hole (through-hole)
117 third through-hole (through-hole)
118 fourth through-hole (through-hole)
120 first resin layer (resin layer)
125 second resin layer
130 wiring path
200, 210 external connection terminal
250 ball bump
300 switch IC
411 first RF terminal
412 second RF terminal
413 first ground terminal (ground terminal)
421 third RF terminal
422 fourth RF terminal
423 second ground terminal
431 third ground terminal
432 fourth ground terminal
500 communication device
501 signal processing circuit
502 RF signal processing circuit
503 baseband signal processing circuit
510 antenna
D1 thickness direction
D2 first arrangement direction (first direction)
D3 second arrangement direction (second direction)

The invention claimed is:

1. A high-frequency module comprising:
a mounting substrate having a first principal surface and
  a second principal surface opposed to each other; and
a filter disposed at the first principal surface of the
  mounting substrate and configured to allow a high-
  frequency signal to pass therethrough, wherein
the filter includes
  a first RF terminal,
  a second RF terminal, and
  a first ground terminal located between the first RF
    terminal and the second RF terminal in plan view in
    a thickness direction of the mounting substrate,
the mounting substrate has a ground layer on the first
  principal surface,
when the mounting substrate is seen in a direction
  orthogonal to a direction connecting the first RF ter-
  minal and the second RF terminal, at least a portion of the ground layer is disposed between the first RF
  terminal and the second RF terminal,
the first ground terminal comprises a solder bump and
  connected to the ground layer, and
the ground layer has a first through-hole in contact with
  the first ground terminal.

2. The high-frequency module according to claim 1,
wherein
the ground layer has
  a first portion connected to the first ground terminal,
  a second portion disposed between the first RF terminal
    and the second RF terminal when seen in the direc-
    tion orthogonal to the direction connecting the first
    RF terminal and the second RF terminal, and
  at least two bridging parts connecting the first portion
    to the second portion, and
the at least two bridging parts form a portion of an edge
  of the first through-hole.

3. The high-frequency module according to claim 2,
wherein
each of the at least two bridging parts has
  a first end connected to the first portion, and
  a second end connected to the second portion, and
a width of each of the at least two bridging parts narrows
  from the first end toward the second end.

4. The high-frequency module according to claim 3,
wherein
the first through-hole provided to the ground layer
  includes a plurality of through-holes.

5. The high-frequency module according to claim 3,
wherein
the filter further includes
  a third RF terminal,
  a fourth RF terminal, and
  a second ground terminal different from the first ground
    terminal,
the second ground terminal is disposed between the third
  RF terminal and the fourth RF terminal in plan view in
  the thickness direction of the mounting substrate,
when the mounting substrate is seen in a direction
  orthogonal to a direction connecting the third RF
  terminal and the fourth RF terminal, at least a portion
  of the ground layer is disposed between the third RF
  terminal and the fourth RF terminal,
the second ground terminal comprises a solder bump and
  connected to the ground layer, and
the ground layer has a second through-hole in contact
  with the second ground terminal and different from the
  first through-hole.

6. The high-frequency module according to claim 3,
wherein
the first RF terminal is an input terminal configured to
  receive the high-frequency signal, and
in plan view in the thickness direction of the mounting
  substrate, the ground layer overlaps a wiring path
  provided inside the mounting substrate and connected
  to the input terminal.

7. The high-frequency module according to claim 2,
wherein
the first through-hole provided to the ground layer
  includes a plurality of through-holes.

8. The high-frequency module according to claim 2,
wherein
the filter further includes
  a third RF terminal,
  a fourth RF terminal, and a second ground terminal different from the first ground terminal, the second ground terminal is disposed between the third RF terminal and the fourth RF terminal in plan view in the thickness direction of the mounting substrate, when the mounting substrate is seen in a direction orthogonal to a direction connecting the third RF terminal and the fourth RF terminal, at least a portion of the ground layer is disposed between the third RF terminal and the fourth RF terminal, the second ground terminal comprises a solder bump and connected to the ground layer, and the ground layer has a second through-hole in contact with the second ground terminal and different from the first through-hole.

9. The high-frequency module according to claim 2, wherein the first RF terminal is an input terminal configured to receive the high-frequency signal, and in plan view in the thickness direction of the mounting substrate, the ground layer overlaps a wiring path provided inside the mounting substrate and connected to the input terminal.

10. The high-frequency module according to claim 1, wherein the first through-hole provided to the ground layer includes a plurality of through-holes.

11. The high-frequency module according to claim 10, wherein the filter further includes a third RF terminal, a fourth RF terminal, and a second ground terminal different from the first ground terminal, the second ground terminal is disposed between the third RF terminal and the fourth RF terminal in plan view in the thickness direction of the mounting substrate, when the mounting substrate is seen in a direction orthogonal to a direction connecting the third RF terminal and the fourth RF terminal, at least a portion of the ground layer is disposed between the third RF terminal and the fourth RF terminal, the second ground terminal comprises a solder bump and connected to the ground layer, and the ground layer has a second through-hole in contact with the second ground terminal and different from the first through-hole.

12. The high-frequency module according to claim 10, wherein the first RF terminal is an input terminal configured to receive the high-frequency signal, and in plan view in the thickness direction of the mounting substrate, the ground layer overlaps a wiring path provided inside the mounting substrate and connected to the input terminal.

13. The high-frequency module according to claim 1, wherein the filter further includes a third RF terminal, a fourth RF terminal, and a second ground terminal different from the first ground terminal, the second ground terminal is disposed between the third RF terminal and the fourth RF terminal in plan view in the thickness direction of the mounting substrate, when the mounting substrate is seen in a direction orthogonal to a direction connecting the third RF terminal and the fourth RF terminal, at least a portion of the ground layer is disposed between the third RF terminal and the fourth RF terminal, the second ground terminal comprises a solder bump and connected to the ground layer, and the ground layer has a second through-hole in contact with the second ground terminal and different from the first through-hole.

14. The high-frequency module according to claim 13, wherein the filter further includes a third ground terminal, and a fourth ground terminal, the third ground terminal is disposed between the first RF terminal and the third RF terminal, and the fourth ground terminal is disposed between the second RF terminal and the fourth RF terminal, in plan view in the thickness direction of the mounting substrate, each of the third ground terminal and the fourth ground terminal comprises a solder bump and connected to the ground layer, when the mounting substrate is seen in a direction orthogonal to a direction connecting the first RF terminal and the third RF terminal, at least a portion of the ground layer is disposed between the first RF terminal and the third RF terminal, when the mounting substrate is seen in a direction orthogonal to a direction connecting the second RF terminal and the fourth RF terminal, at least a portion of the ground layer is disposed between the second RF terminal and the fourth RF terminal, and the ground layer further has a third through-hole in contact with the third ground terminal and a fourth through-hole in contact with the fourth ground terminal.

15. The high-frequency module according to claim 14, wherein the first RF terminal and the second RF terminal are aligned in a first direction, and the third RF terminal and the fourth RF terminal are aligned in the first direction, and the first RF terminal and the third RF terminal are aligned in a second direction orthogonal to the first direction, and the second RF terminal and the fourth RF terminal are aligned in the second direction.

16. The high-frequency module according to claim 13, wherein the first RF terminal is an input terminal configured to receive the high-frequency signal, and in plan view in the thickness direction of the mounting substrate, the ground layer overlaps a wiring path provided inside the mounting substrate and connected to the input terminal.

17. The high-frequency module according to claim 1, wherein the first RF terminal is an input terminal configured to receive the high-frequency signal, and in plan view in the thickness direction of the mounting substrate, the ground layer overlaps a wiring path provided inside the mounting substrate and connected to the input terminal.

18. A communication device comprising:

the high-frequency module according to claim 1; and a signal processing circuit configured to process the high-frequency signal passing through the high-frequency module.

19. A high-frequency module comprising:

a mounting substrate having a first principal surface and a second principal surface opposed to each other; and a filter disposed at the first principal surface of the mounting substrate and configured to allow a high-frequency signal to pass therethrough, wherein the filter includes a first RF terminal, a second RF terminal, and a ground terminal located between the first RF terminal and the second RF terminal in plan view in a thickness direction of the mounting substrate, the mounting substrate has a ground layer on the first principal surface, when the mounting substrate is seen in a direction orthogonal to a direction connecting the first RF terminal and the second RF terminal, at least a portion of the ground layer is disposed between the first RF terminal and the second RF terminal, the ground layer has a first portion connected to the ground terminal, a second portion disposed between the first RF terminal and the second RF terminal when seen in the direction orthogonal to the direction connecting the first RF terminal and the second RF terminal, and at least two bridging parts connecting the first portion to the second portion, and the ground terminal comprises a solder bump and connected to each of the at least two bridging parts.

20. The high-frequency module according to claim 19, wherein in each of the at least two bridging parts, a width of a portion connected to the ground layer is shorter than a diameter of the ground terminal.

* * * * *